(12) United States Patent
Vorobeichik et al.

(10) Patent No.: US 10,855,045 B2
(45) Date of Patent: Dec. 1, 2020

(54) DYNAMICALLY-DISTRIBUTABLE MULTIPLE-OUTPUT PUMP FOR FIBER OPTIC AMPLIFIER

(71) Applicant: NeoPhotonics Corporation, San Jose, CA (US)

(72) Inventors: Ilya Vorobeichik, Los Gatos, CA (US); Edward C. Vail, Menlo Park, CA (US); Anthony J. Ticknor, Cupertino, CA (US)

(73) Assignee: NeoPhotonics Corporation, San Jose, CA (US)

( * ) Notice: Subject to any disclaimer, the term of this patent is extended or adjusted under 35 U.S.C. 154(b) by 527 days.

(21) Appl. No.: 15/491,085

(22) Filed: Apr. 19, 2017

(65) Prior Publication Data

US 2017/0222390 A1 Aug. 3, 2017

Related U.S. Application Data

(62) Division of application No. 14/507,490, filed on Oct. 6, 2014, now Pat. No. 9,660,421.

(Continued)

(51) Int. Cl.
*H01S 3/0941* (2006.01)
*H01S 3/094* (2006.01)
(Continued)

(52) U.S. Cl.
CPC ........ *H01S 3/0941* (2013.01); *H01S 3/06758* (2013.01); *H01S 3/094003* (2013.01); *H01S 3/094061* (2013.01); *H01S 3/094096* (2013.01); *H01S 3/2391* (2013.01); *H01S 5/4031* (2013.01); *H01S 3/1608* (2013.01); *H01S 5/02216* (2013.01); *H01S 5/02284* (2013.01); *H01S 5/02415* (2013.01)

(58) Field of Classification Search
CPC ............... H01S 3/0941; H01S 3/06758; H01S 3/094003; H01S 3/094061; H01S 3/094096; H01S 3/2391; H01S 5/4031
See application file for complete search history.

(56) References Cited

U.S. PATENT DOCUMENTS 5,107,091 A 4/1992 Wagner et al.
5,761,234 A 6/1998 Craig et al.
(Continued)

OTHER PUBLICATIONS

Agrawal et al, Semiconductor Lasers, Van Nostrand Reinhold publishers, (Jul. 1993), 2nd Edition.
(Continued)

*Primary Examiner* — Eric L Bolda
(74) *Attorney, Agent, or Firm* — Christensen, Fonder, Dardi & Herbert PLLC; Peder M. Jacobson; Peter S. Dardi

(57) ABSTRACT

A multiple-output laser component is described with a plurality of diode lasers in a common package, each of the diode lasers having distinct electrical control and optically coupled to a distinct output fiber, the component configured such that up to a maximum total output power can be selectively and dynamically partitioned among said diode lasers. The dynamic allocation can be based on demand for laser power in a fiber optic coupled to each diode laser. The multi-output laser component can be used to drive amplifiers associated with a multicast switch in some embodiments.

22 Claims, 6 Drawing Sheets

Related U.S. Application Data

(60) Provisional application No. 61/887,531, filed on Oct. 7, 2013.

(51) Int. Cl.
*H01S 5/40* (2006.01)
*H01S 3/067* (2006.01)
*H01S 3/23* (2006.01)
*H01S 5/022* (2006.01)
*H01S 3/16* (2006.01)
*H01S 5/024* (2006.01)

(56) References Cited

U.S. PATENT DOCUMENTS

| | | | |
|---|---|---|---|
| 5,953,359 A * | 9/1999 | Yamaguchi | H01S 5/0265 372/23 |
| 6,501,773 B1 | 12/2002 | Volz et al. | |
| 6,567,432 B1 | 5/2003 | Kim et al. | |
| 6,922,278 B2 | 7/2005 | Vail et al. | |
| 7,505,493 B1 | 3/2009 | Jacob | |
| 7,653,109 B2 | 1/2010 | Bischel et al. | |
| 7,899,334 B2 | 3/2011 | Zhong et al. | |
| 8,213,479 B2 | 7/2012 | Doerfel et al. | |
| 2004/0120369 A1 | 6/2004 | Fairgrieve et al. | |
| 2004/0151227 A1 | 8/2004 | Bhowmik et al. | |
| 2004/0208213 A1 | 10/2004 | Lichtenstein et al. | |
| 2006/0018007 A1 | 1/2006 | Gurusami et al. | |
| 2007/0152225 A1 | 7/2007 | Ooi et al. | |
| 2010/0290498 A1 | 11/2010 | Hata et al. | |
| 2012/0051688 A1 * | 3/2012 | Pitwon | H01S 3/0637 385/14 |
| 2013/0108215 A1 * | 5/2013 | Ticknor | G02B 6/35 385/17 |

OTHER PUBLICATIONS

International search report and written opinion of co-pending application PCT/US2014/059401 dated Jan. 21, 2015 (13 pages).

* cited by examiner

DYNAMICALLY-DISTRIBUTABLE MULTIPLE-OUTPUT PUMP FOR FIBER OPTIC AMPLIFIER

CROSS REFERENCE TO RELATED APPLICATIONS

This application is a divisional of U.S. patent application Ser. No. 14/507,490 to Vorobeichik et al., entitled "Dynamically-Distributable Multiple-Output Pump for Fiber Optic Amplifier," which claims priority to U.S. patent application Ser. No. 61/887,531 to Vorobeichik et al. filed Oct. 7, 2013, entitled Dynamically-Distributable Multiple-Output Pump for Fiber Optic Amplifier," both of which are incorporated herein by reference.

FIELD OF THE INVENTION

The technical field of the invention relates to components supporting multiple-wavelength optical signal amplifier. The invention further relates to subsystems for optical wavelength routing and management configured to benefit from the use of such amplifiers.

Glossary

Node: Complex opto-electronic subsystem for managing interconnection of many optical and electronic data signals typically connected to multiple optical transport fibers as well as local tributaries.

Level: As applied to a section of a node, a subset of the node equipment and functionality all providing similar capabilities and generally all placed at the same logical position in the signal processing flow. As a general abstraction, data signals move from level to level proceeding through the node.

Drop Mode: Directing data signals from the transport network towards the node periphery Add Mode: Directing data signals from the node periphery towards the transport network Through Mode: Directing data signals inbound on the transport network directly to the desired output to the transport network without passing through the local-access levels of the node.

Line-Facing: The ports of a node level functionally disposed towards the transport network Client Facing: The ports of a node level functionally disposed away from the transport network.

BACKGROUND OF THE INVENTION

Modern optical communications networks are universally used to interconnect distant, regional, and metropolitan communications hubs for directing numerous diverse streams of telephony, digital video, internet, and other types of digital data. In order to efficiently and economically manage the ever-increasing capacity and speed demands on these networks, many communications channels are aggregated into streams each carrying up to and foreseeably greater than 100 gigabits per second per aggregated data stream. Dozens of these data streams are transmitted simultaneously through each fiber in the network utilizing dense wavelength-division multiplexing (DWDM) where each stream is carried by an optical signal having an optical wavelength slightly different but fully distinguishable from all the other wavelengths for the other streams in the fiber. The data for each wavelength may be represented as an intensity modulation, typically used for data streams of 10 gigabits per second or below, or the data may be represented by more complex 'coherent' modulation of the optical field, which is typically used for data streams carrying greater than 10 gigabits per second. The set of optical data streams that are wavelength multiplexed into an individual fiber may comprise wavelengths that have been modulated according to different data rates and/or different modulation formats. These optical streams are routinely combined and separated as appropriate by various optical filter components at each end of the optical fiber link. Increasingly, it is desirable that the terminal or intermediate optical filtering processes is designed to be insensitive to the embedded optical data rate or format and adaptable to different wavelengths or collections of wavelengths. Herein throughout the use of 'wavelength' as a subject refers to a data stream of any appropriate data rate and format encoded onto an optical carrier having a distinctive, but not necessarily herein specified, wavelength. With current communication systems, wavelengths range from about 1250 nanometers (nm) to about 1750 nm, although wavelengths used in communication systems generally evolve with the technology. DWDM systems utilizing optical fiber amplifiers generally use the C-band (approximately 1520 nm to 1570 nm) or L-band (approximately 1570 nm to 1620 nm). Each of these bands spans about 6000 Giga-Hertz (GHz) of optical frequency, and DWDM systems typically segregate these bands into separate channels every 50 GHz or 100 GHz. Even though these channels are allocated and managed according to their optical frequencies, it is customary to call them 'wavelength' channels.

The optical networks include many locations where optical fibers intersect and/or provide access points. These locations are commonly referred to as 'nodes'. Many individual wavelengths come to the node along each of the fibers, but not all the wavelengths on any fiber are necessarily bound for the same destination. Some of the wavelengths may be bound for access destinations local to the node, there may be new wavelengths originating local to the node, and other wavelengths may need to be independently rerouted and re-multiplexed among the various outbound fibers from the node. Management of all these individual wavelengths at the node may be performed in the optical domain or in the electrical domain or distributed into combinations of both. Tradeoffs between optical-domain and electrical-domain switching are many, varied, and application specific. However, in general optical domain switching consumes only a small fraction of the energy that must be provided for electrical-domain switching and also can provide insensitivity to data rates and formats. The power that is provided to the optical node subsystems is substantial and often what limits the available performance and drives the operating costs. It is therefore generally desirable to do as much of the management of wavelengths in the optical domain as is practical.

SUMMARY OF THE INVENTION

Optical amplification at the input of a multicast switch (MCS) based on an erbium doped fiber amplifier (EDFA) technology or the like generally involves an array of independent EDFAs, one EDFA element for each MCS input. Conventional EDFA designs can be designed to support up to ~80 signal wavelengths. However, in this application the wavelength selective switches (WSSs) in the previous level of the structure, e.g., a node, provide only a selected number of wavelengths to each MCS input. For an M×N MCS, the WSS level should not supply more than N wavelengths to any MCS input to avoid substantial inefficiencies. Furthermore, the total number of wavelengths across all M inputs coming from the WSS level can be limited to N. The power level of the optical pump for the EDFA can be proportional to the number of signal wavelengths in the fiber. Therefore in an MCS application, the optical pump laser of a conventional EDFA supporting up to 80 wavelengths would always be underutilized. This is recognized in U.S. Pat. No. 7,899,334 to Zhong et al. and assigned to Ciena Corporation ('334 patent). In the '334 patent it is suggested to replace the N pump lasers of an N-array of EDFA's with a single pump laser and a 1×N tunable optical splitter to distribute portions of the optical pump power to each EDFA fiber according to demand. Since the pump laser in an EDFA represents a substantial portion of the cost, size, and operating budget of the EDFA, this offers substantial savings in those areas for the EDFA array. This is a schematically-effective improvement, but due to the properties of tunable optical splitters presents significant new problems including inability to respond to transient effects in a timely manner (i.e. when the wavelength mix changes), adds new sources of thermal drift and crosstalk that must be separately tracked and compensated, and fails to provide certain other desired flexibilities such as temporary overdrive. The technical findings supporting the pump laser designs described herein show that it is possible and desirable to provide a single pump-laser component having multiple lasing segments, each optically coupled to a corresponding output fiber. The actual lasing segment in a pump-laser component occupies an infinitesimal fraction of the space of the component and expanding the load across several available segments can be done without changing the component size or operating conditions and minor impact on cost to build. The fibers exiting the package occupy a small fraction of the package boundary through which they pass, so increasing the number of output fiber to 4 or 16 or so also will not drive up the size of the component. The inventive pump laser component can readily look and behave much like the conventional pump-laser component, merely having additional fiber outputs and redefinition of the electrical pin functions to support changing the power distribution among the outputs.

In a first aspect, the invention pertains to a multiple-output laser component comprising a plurality of diode lasers in a common package and a controller, each of the diode lasers having distinct electrical control and optically coupled to a distinct output fiber, wherein the controller distributes electrical power to each of the laser diodes such that up to a maximum total optical output power can be selectively and dynamically allocated among said diode lasers. In some embodiments, an amplified optical switch can comprise a pumped optical amplifier array of the invention and an N×M multicast switch wherein the amplifier array is configured to receive light directed into each of N input channels of the multicast switch.

In a further aspect, the invention pertains to a method for driving a pumped optical amplifier array in which the method comprises dynamically distributing power from a power supply to elements of a laser array according to specific demand for amplification at an amplifier array based on optical signals being received at the amplifier array. Generally, each element of the laser array can be configured to delivery laser output to a specific element of the amplifier array.

In another aspect, the invention pertains to a multicast switch module comprising a PLC N×M multicast switch having N inputs (MCS inputs), an array of N independently drivable pump laser elements on a common substrate, and N optical amplifiers with each optically connected to an input waveguide, an independently drivable laser element and an MCS input.

DESCRIPTION

Figure 1:
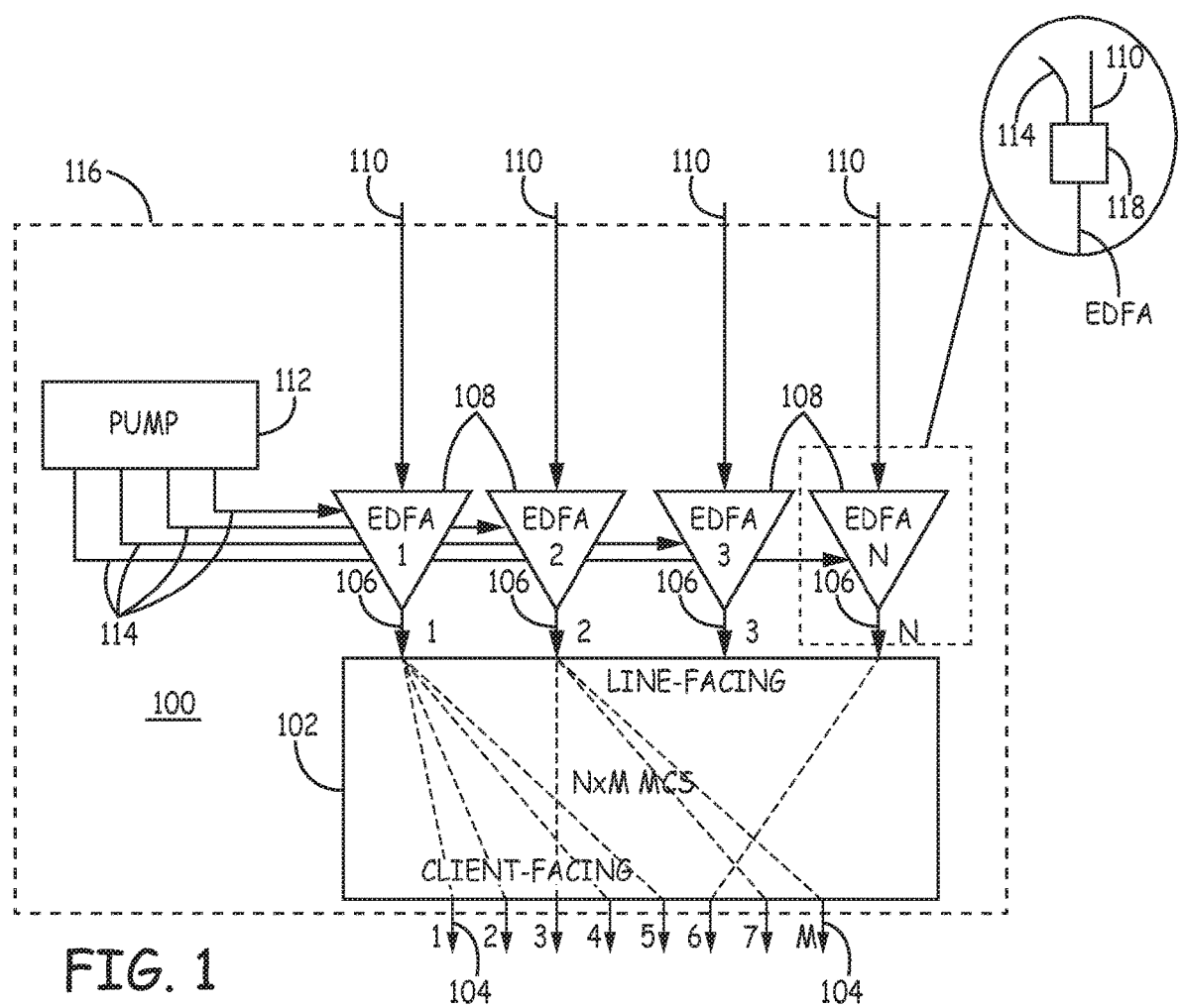
FIG. 1 is a schematic view depicting the basic components of an amplified optical switch with a pump laser array driving the amplifier array.

A pumped optical amplifier array can comprise an array of diode lasers with a plurality of elements each optically connected to an element of the amplifier array in which electrical power from a power supply can be distributed as needed to particular laser elements so that an element of the amplifier receives pump laser power corresponding to the optical signals being directed through the amplifier element. Since laser power can be adjusted dynamically to match amplification demand, the overall power consumption can be reduced through the reduction of waste. In some embodiments, the laser elements are supported on a common substrate, and one or more common elements of the laser can be shared among the elements. In some embodiments, the total optical output can be composed from any distribution among the laser elements such that the total output does not exceed a predetermined output limit. The pumped optical amplifier array can be well suited for use with a Multicast Switch (MCS) for optical communications applications, but the pumped optical amplifier array can be effectively used in other optical communications contexts or other suitable applications. To support descriptions of certain embodiments of optical system designs, the following discussion focuses to a significant degree on the use of the pumped optical amplifier array in the context of optical telecommunications and more specifically on use with MCS components, and other applications follow appropriately from these teachings.

The multiple-output laser array generally comprises multiple lasing segments, in which a single lasing segment occupies a very small fraction of the space of the component. The laser elements can share a common thermal management system, which may operate independently of power distribution among the outputs. Total laser power output can dynamically adjust among the outputs, such as from all power output through a single optical output or selectively distributed among the optical outputs. Generally, the total power output has a design cap for distribution appropriately, and it can be possible to allow the total power to exceed the design cap for specified short periods of time. The design of the multiple-output laser is particularly convenient in the context of a semiconductor laser in which the lasing elements are mounted on a common diode substrate or common submount as an integrated structure in which power allocation is achieved through gating of electrical current provided to the respective diodes.

The following characteristic descriptions generally take the perspective of a signal 'drop', which is signals being routed from the network fiber towards the edge of the node subsystem. It is implied that there would be similar optical components supporting the corresponding signal 'add' from the tributaries to the node subsystem into the outbound network fibers. The descriptions of these 'add' optical components are generally equivalent to the 'drop' descriptions but with the roles of 'input' and 'output' reversed.

Recent evolution in network-node subsystems for wavelength management provides architectures where the functional operations can be separated into architectural levels of signal management, with inner levels near the network fibers providing optical-domain functions and electrical-domain functions positioned in the outer levels. The innermost architectural level more and more commonly is composed of multiple Wavelength Selective Switches (WSSs). The WSSs break out the wavelengths from the network fibers into smaller, selectable groups of wavelengths. Due to the physical nature of a WSS, it is not practical for the WSSs to provide enough ports to break-out all the wavelengths into individual ports. Some of these groups of selected wavelengths are passed to other WSSs in the inner level and thereby transferred to other network fibers. Other groups of selected wavelengths are forwarded to the next architectural level. Increasingly this next level comprises Multi-Cast Switches (MCS) for receiving these other groups of selected wavelengths. An MCS and its application characteristics are described in more detail for instance in published U.S. patent application 2013/0108215, entitled "Scalable Optical Switches and Switching Modules," incorporated herein by reference. The function of an MCS has been properly summarized by others in a number of different ways, but for the purposes of describing the context for its present application, it can be seen as an optical component for expanding the number of available ports from the WSSs such that many more individual wavelengths can be redirected simultaneously. For instance, a 4×16 MCS receives its input from one port from each of 4 WSSs and distributes intensity portions from each of those inputs towards each of the 16 MCS outputs. Thereby, any of the MCS input wavelengths are available independently at any of the MCS output ports at any time. Generally the desired output wavelength can be combined with portions of other wavelengths, but the output of the MCS is typically passed to the next architectural level comprising detectors capable of discriminating the single wavelength of interest to that specific channel. This second level architectural framework comprising MCSs provides an operationally-efficient and cost-effective means of delivering specific optical wavelengths to a moderate-to-large number of optical receiver channels.

Since the MCS operates by distributing intensity portions from the optical input towards the optical output, there is a corresponding reduction in the optical power and that can reduce the fidelity of the optical data signal. Therefore, it can be desirable to include optical amplification in this MCS level to compensate for the loss of optical power due to distribution. Since there are fewer MCS inputs than outputs, it is generally preferable to provide the amplification at the inputs. A well established and desirable way of providing optical amplification for multiple telecommunications wavelengths in an optical fiber is the use of erbium-doped fiber amplifiers (EDFA), although other amplifiers, such as erbium doped waveguide amplifiers, Raman amplifiers, semiconductor amplifiers or other amplifier designs can be used if desired. In such a fiber segment of an EDFA, interaction of the optical signals with energized erbium atoms provides amplification of the optical data signals. The erbium atoms draw energy from a separate, more powerful, optical field also travelling through the fiber, but at a remote wavelength outside the range of wavelengths used for the data signals. This more powerful, out-of-band optical signal is provided by an optical 'pump' laser or other pump light source. Lasers as described herein provide improvements for this application of EDFAs and these pump devices, or any other amplifiers utilizing optical pumps.

In the decade or so preceding the advances described herein, increased emphasis on optical-domain wavelength management has been emerging to complement the electronic-domain management in concurrence with, and in fact enabling the increase in bandwidth of the data passing through nodes of communication systems. As outlined previously herein, wavelength switching in the optical domain generally treats each wavelength as a cohesive unit and passes each wavelength transparently to its destination within the node, such as either an output fiber or an optical receiver at the edge of the optical domain. The composed optical routing effectively establishes a physical path for the light at the selectable wavelengths from the attached input network fibers to be passed linearly and directly to the desired output network fiber or local port. The optical domain levels essentially pass any selected optical data regardless of format or content as long as it is within the optical wavelength range specified for the selected optical channels. Since the optical routing cannot modify the detailed data within the optical wavelength, it is not as flexible as converting the channels into the electrical domain. But more significantly, the power required to route the data in the optical domain is merely the amount of power needed to establish and maintain the optical path through those levels, which is generally orders of magnitude less than required for electronically routing the same data. As power consumption is often the limiting factor for the bandwidth that can be managed by a node, flexible optical routing is not merely a convenience of remote configuration, but clearly enables the current and future performance levels of optical networks.

An MCS generally has both line-facing optical ports and client-facing optical ports. The number of client-facing optical ports provided can be larger than the number of line-facing optical ports as that is the primary purpose of an MCS. Due to the fundamental nature of the MCS, only a fraction of the power in an optical signal can be coupled between a line-facing port and a client-facing MCS port. Generally the maximum coupling fraction through an MCS is 1/N where N is the number of client-facing ports in the MCS. In the case of an expandable MCS module as described in the incorporated patent application 2013/0108215, N is the number of client-facing ports in the module. Compensation for this loss can be accomplished by attaching a separate EDFA to each line-facing port of the MCS. The EDFA amplifies each wavelength signal passing through. Therefore, each wavelength increases the level of optical pump power to be provided to a particular EDFA. The communications demands on the connected optical networks continuously change as local and remote users and services connect and disconnect. The node subsystem accommodates the changing demands by dynamically reconfiguring the connections of wavelengths through the nodes. As the wavelength connections within the node change, the number of wavelengths in each line-facing port of an MCS change, changing the level of pump power to be supplied to each EDFA. However, the maximum sum of wavelength signals in all the line-facing ports is fixed by the net capacity of the receivers, transmitters, or other optical devices connected to the line-facing ports of the MCS.

For example, a 4×16 drop-mode MCS would have 4 line-facing ports each typically coupled to one port of different WSSs in the WSS level and 16 client-facing ports each typically coupled to a single-wavelength receiver. In this case, an EDFA would be integrated to each of the 4 line-facing ports, coupled between the WSS level and the physical inputs of the core MCS. Since there are only 16 single-wavelength receivers available, the MCS cannot utilize more than a total of 16 wavelength signals across all 4 line-facing ports. Since the WSS level will not couple a wavelength to an MCS unless there is an associated client-facing device assigned to that signal, one can be assured that there will never be more than 16 wavelength signals coupled to the MCS in this example. Note that it is possible to have more than one distinct signal having the same numerical wavelength carrier coupled to the MCS through different line-facing ports, but the MCS-based architecture is designed to accommodate such situations, and it is not a problem. Each distinct signal is counted as one against the total, even if some have identical wavelengths. The operation of other sized MCS operate similarly with adjustment for the particular line numbers.

Continuing with the 4×16 drop-mode example, as the node connection patterns change, the number of signals in each of the 4 line-facing input ports may change around, but the total never exceeds 16. At one point in time, there may be 4 signals in each of the input ports, at another time there may be 16 in one input port and none in the other three. At other times, there may be any suitable combination of signals coupled to the input ports totaling no more than 16. The level of pump power to be supplied to each EDFA is proportional to the number of wavelength signals coupled to the corresponding port. If one input port carries all 16 wavelengths, then the full output power of an appropriate-sized pump laser should be directed to that EDFA. If the wavelength signals are more equally distributed among the input ports, then each EDFA should receive less than the full pump power. The multiple-output pump laser described herein can appropriately distribute the pump power to match the power requirements of the EDFAs. These concepts naturally generalize for different sized MCS devices with respect to input lines being served by EDFAs, and output lines which only help to determine the total possible signals distributed across the input lines.

Using conventional design approaches, each EDFA would have an individual pump laser sized to accommodate the maximum number of wavelengths that might be coupled to the entire MCS. At any given time, most of the pump lasers could be either off or running at substantially reduced power. This conventional design with chronic overcapacity leads to inefficient use of the cost, size, and thermal design of the pump-laser subsystem, each contributing a substantial portion to the cost, size, and thermal limitations of the overall amplified MCS module.

Others have suggested, such as in U.S. Pat. No. 7,899,334 entitled "Signal Distribution Module for a Directionless Reconfigurable Optical Add/Drop Multiplexer, incorporated herein by reference, using a single pump laser coupled to a 1×N variable optical splitter to distribute the pump power among the N EDFAs. This is a substantial improvement in concept, but the optical splitter presents some notable new problems. Such a splitter is difficult to manufacture to the necessary specifications, particularly at the 980 nm wavelength desired for the EDFA pump, and particularly difficult to integrate with other passive optical components used in the EDFA array. This would generally lead to a variable-splitter component that is relatively large and expensive compared to typical integrated-optic components. More importantly, such variable optical splitters generally do not respond quickly enough to compensate for the transient side-effects produced when wavelengths are inserted, deleted, or moved among the amplifier array, can produce greater levels of crosstalk attempting to deal with transient compensation, and can have a more limited dynamic range than conventional transient suppression. Available variable splitter designs can lead to very poor performance for these devices, if not outright inadequate performance, when using a variable optical splitter to distribute the pump power among an EDFA array.

The coupling of an array of lasers on a chip to a set of optical fibers is described in U.S. Pat. No. 7,653,109 to Bischel et al. (the '109 patent), entitled "Multi-Channel Laser Pump Source for Optical Amplifiers," incorporated herein by reference. In contrast to the structure described in the '109 patent, in some embodiments, the structures described herein can involve dynamic power distribution to drive the laser elements in a power efficient way. Also, in some embodiments, the diode laser arrays can comprise a passive waveguide fanout to provide for adaptation of the laser die geometry with a fiber-array geometry. These constructions can significantly simplify the construction while maintaining low optical loss.

Figure 3:
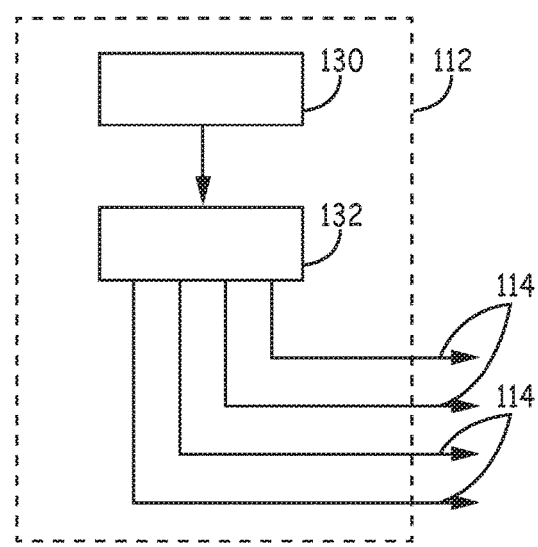
FIG. 3 is a schematic diagram of a single pump laser routed through a tunable beam splitter.
Figure 2:
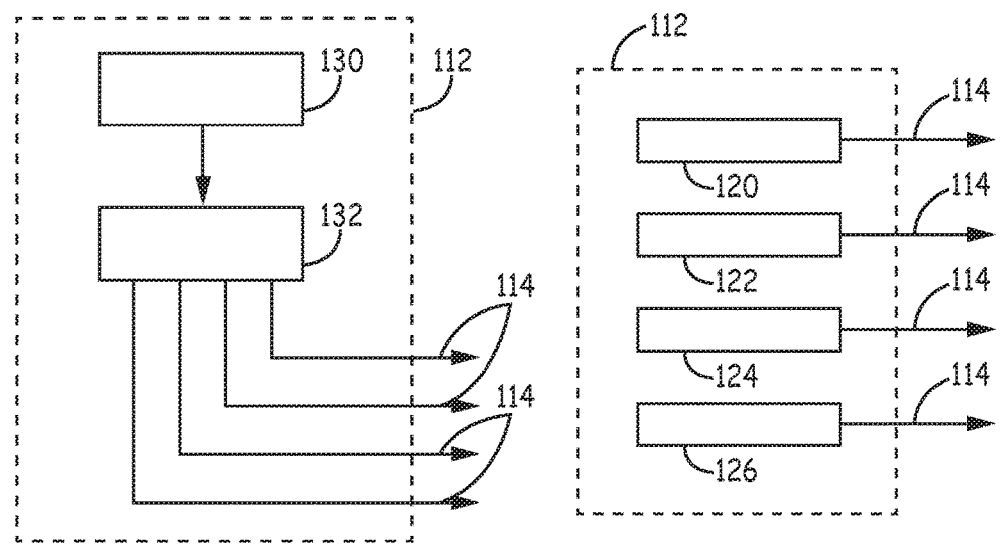
FIG. 2 is a schematic diagram of a pump laser array comprising 4 individual diode laser chips.
Figure 4:
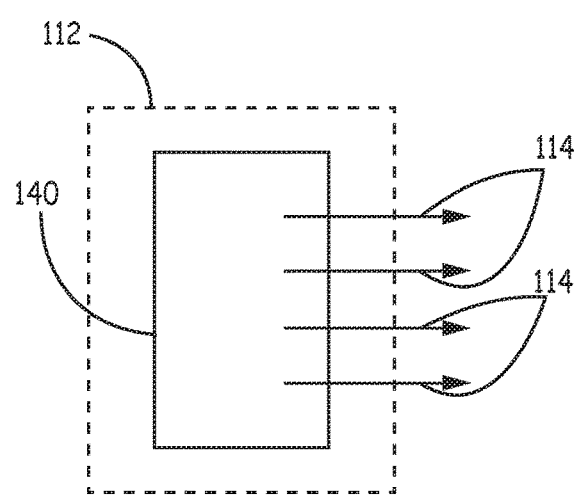
FIG. 4 is a schematic diagram of a laser array on a common substrate connected to an array of optical output channels.

Referring to FIG. 1, an amplified MCS device 100 comprises MCS component 102 with M outputs (client-facing) 104 and N inputs (line-facing) 106, N EDFA components 108 optically connecting MCS inputs 106 with N device inputs 110, pump component 112 optically connected through N light channels 114 with EDFA components 108 and an optional enclosure 116. Implicitly, each EDFA component 108 also includes an optical coupler 118 to couple an input 106 and light channel 114, as shown in the insert of the figure. A pump component 112 comprising N individual pump laser elements is depicted in FIG. 2 with 4 pump lasers elements 120, 122, 124, 126. The suggestion for combining a single pump laser 130 with an external variable optical splitter, or tunable splitter 132, to provide pump power in a pump component to a multi-EDFA array is depicted in FIG. 3. Some of the drawbacks of the tunable splitter approach have also been described above. Another perspective of this is that with current technology optical-domain management is a premium function within a limited range. It is premium in that it exhibits very-low power consumption for high-speed data management and is insensitive to data format and speed. It has limited range compared to electronic solutions in that it cannot be changed quickly, is less flexible, and occupies more space and cost regardless of whether the premium qualities are exploited or not. Since the pump laser does not carry data signals or other high-speed modulation, the application is not well matched to the optical splitting solution. Pump component 112 comprising multiple-output pump laser 140 is depicted in FIG. 4.

Figure 5:
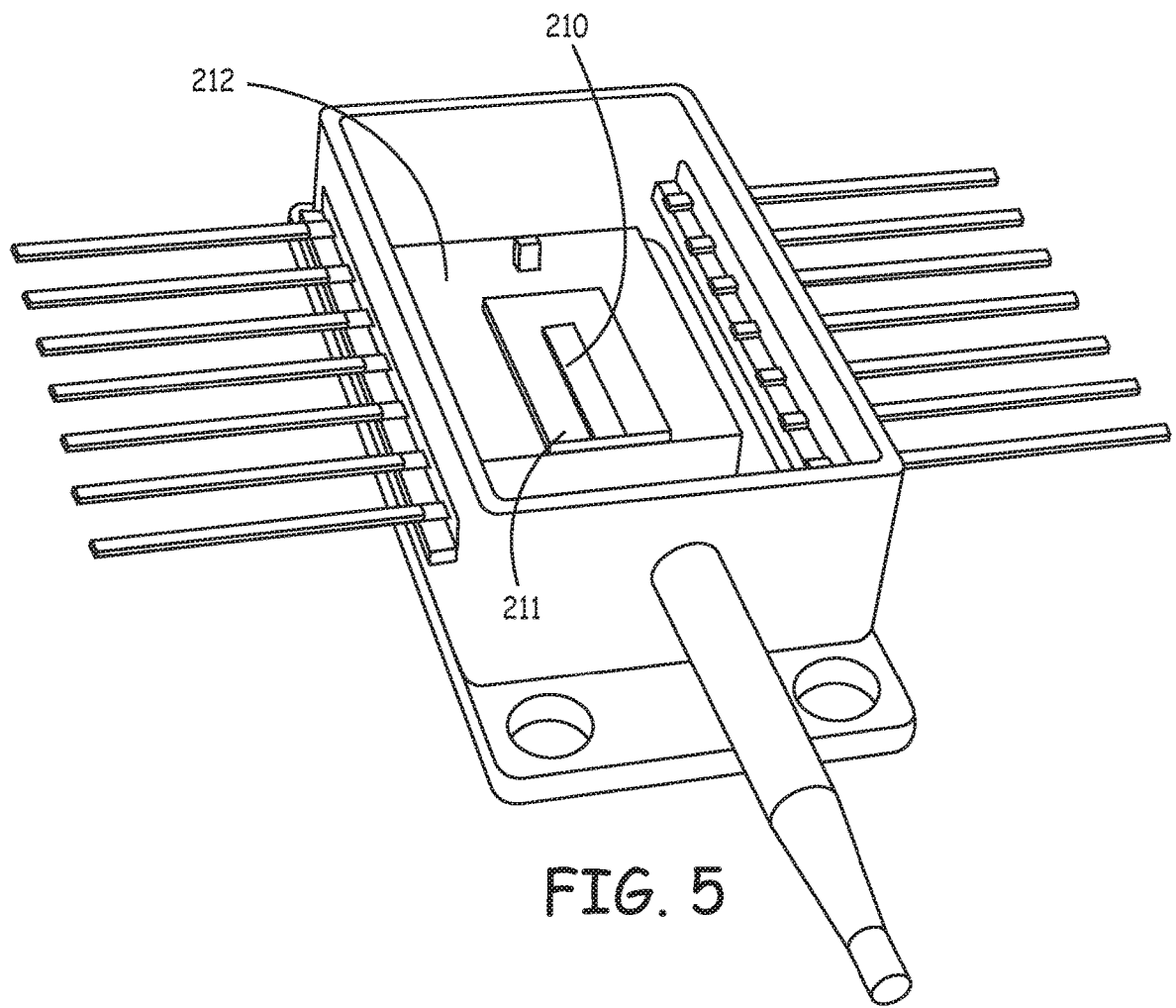
FIG. 5 is a schematic diagram of the relative packaging configuration of a cooled pump laser module with the cover removed to show the interior.

FIG. 5 depicts a relative packaging configuration for a typical medium-to-high power cooled pump laser. The actual laser-diode chip 210 occupies a very small volume of and footprint within the available package cavity. The laser chip 210 is mounted on a thermally-conductive submount 211 which is thermally attached to a thermo-electric cooler (TEC) block 212 which further uses the package body as a heatsink. It is clear here that that thermal and total-power considerations have a substantial impact on the size, manufacturing cost, and operating costs of a pump-laser module.

Figure 6:
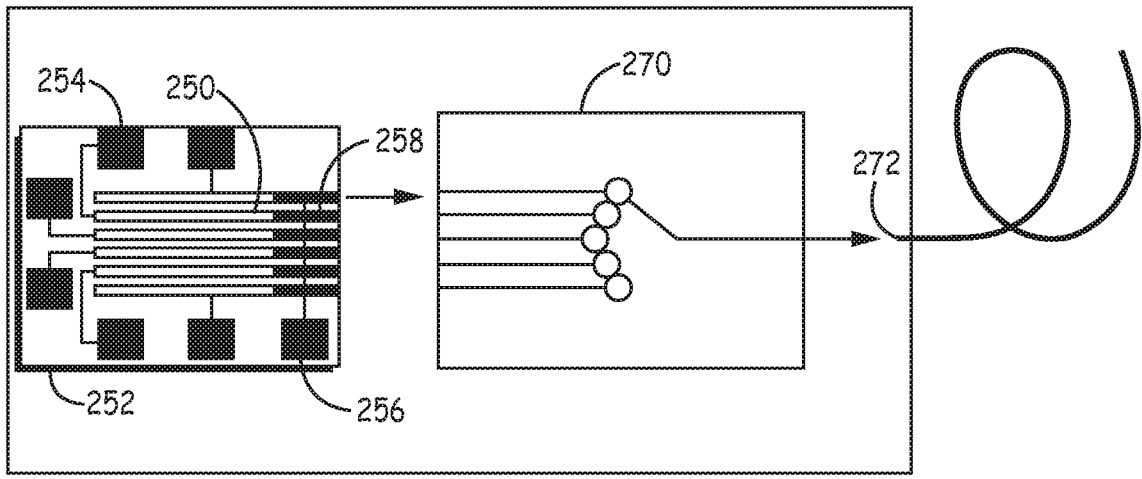
FIG. 6 is a schematic diagram of a device with a laser array intended to operate with one constituent laser at a given time.

U.S. Pat. No. 6,922,278 by Vail et al. (the '278 patent), assigned to NeoPhotonics Corp, describes a laser array where only one of the constituent lasers is intended to be operated at any given time. This is depicted for example in FIG. 6. Multiple laser elements 250 can be fabricated on a single chip 252 separated by only a few tens of microns. Contact pads 254, 256 can provide power to drive solid state lasers 250. Since the lasers of the '278 patent are intended to generate optical communication signals, laser elements 250 are interfaced with electro-optic modulators 258 that modulate the optical signals to introduce the signal information, which are not needed for a pump laser. As taught in the '278 patent, light from the laser array is directed to an optical switch 270 and from the optical switch to optical fiber 272. A similar integrated laser element design can be adapted for the present application in which the optical switch is replaced by a set of light channels and the driving of the lasers can be dynamically adapted to provide laser output in desired light channels.

Figure 7:
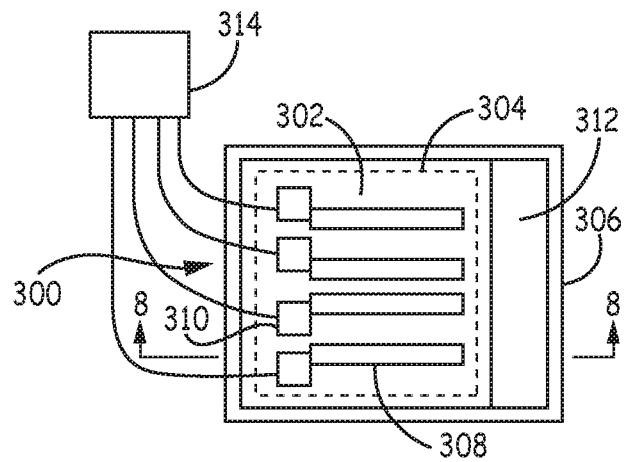
FIG. 7 is a schematic top plan view of a diode laser array module with laser elements on a common substrate.
Figure 8:
FIG. 8 is a sectional view of the diode laser array module of FIG. 7 taken along lines 8-8 of FIG. 7.

A top view of a pump laser array 300 is depicted in FIG. 7. Pump laser array 300 differs from laser element 250 of FIG. 6 in several significant respects. In particular, pump laser array 300 generally does not comprise electro-absorption modulators since the laser output is not modulated to introduce a signal coded in the laser output. Also, pump laser array 300 generally comprises an array of lasers having approximately the same wavelength output. In addition, pump laser array 300 is connected to a laser driver that is designed to distribute the laser power appropriately to selected lasers in the array. Referring to FIG. 7, pump laser array 300 comprises a substrate 302, a base electrode 304, a thermal cooling element 306, an array of laser elements 308, a corresponding array of drive electrodes 310, output waveguide array 312, shown schematically in this view, and controller 314. Base electrode 304 is shown in phantom lines in FIG. 7 since it may not be visible in a top view. Base electrode may be smaller, larger or commensurate with the bottom of substrate independently in various dimensions, and the shape of base electrode 304 may or may not be the same as the shape of the bottom of substrate 302 as long as base electrode 304 can function as one electrode for laser elements 308. A sectional view is shown in FIG. 8.

Generally, substrate 302 can be formed from any stable material with an appropriate surface and some electrical conductivity. To provide for the processing of the other components, substrate 302 generally should be able to tolerate relatively high temperatures, and suitable materials include silicon wafers, indium phosphide, other semiconductors or the like. Electrodes 304, 310 generally are formed as metal films, although any electrically conductive material can be used in principle. Metal film electrodes can be formed by physical vapor deposition, sputtering or the like. Also, metal film electrodes can be formed with metal paste or inks, such as silver pastes with silver nanoparticles that can be thermally processed into highly conductive films. Pattering of electrodes 310 can be performed, for example, with photolithographic etching or with selective printing of a silver paste or other suitable approach. While FIG. 7 displays the device with a single base electrode providing connections to all of the lasers in array 308, individual or group electrodes can be used if desired, in which the base electrodes are appropriately patterned. However, a single base electrode can be processed conveniently and can be used, for example, as the electrical ground to provide for stable operation of the lasers. Cooling element 306 can be a thermoelectric cooler, heat spreader, heat sink or the like.

Various designs of the laser elements in array 308 can be used with effective results. Common elements of the laser elements are p-doped semiconductor material and n-doped semiconductor material forming a p-n junction. Many diode laser designs have multiple alternating layers of compound semiconductors, and lasing can originate from the alternating layers, which can function as a quantum well with holes and electrons injected from the surrounding doped semiconductor layers. The ends of the laser element can have straight terminated edges that complete the resonator or laser cavity with light reflecting back through the resonator until lasing occurs. The edge of the laser cavity opposing the emitting edge can be coated with a reflective surface coating that generally reflects at least 90% of the light back through the cavity. Current flows laterally through the structure between the electrodes of opposite polarity, and the current flow drives the lasing.

In some embodiments of the laser modules, multiple individual laser die are assembled into an array within a single package having an operating rule specifying the total optical output power of the package.

The laser emitters can be formed as distinct elements on a single substrate with appropriate optical channels for the laser output. Alternatively or additionally, the laser emitters can share common elements similar to the structures in the '278 patent except that the laser emitters are generally designed to operate at a common emission wavelength. For example, it can be desirable for the structure to comprise a common substrate with one electrode, generally a metal layer or the like along one surface of the substrate and a common heat sink. Each emitter element is then assembled on the opposite surface of the substrate, and each emitter element comprises a counter electrode, a laser cavity, and p-type and n-type semiconductor elements to initiate electron-hole pairs that result in the population inversion to drive the laser based on stimulated emission within the laser cavity. Within a set of common structural elements, various laser diode structures can be assembled.

In the example of an EDFA, pump lasers would preferably provide optical power at a free-space wavelength near either 980 nanometers (nm) or 1480 nm, with 980 nm being typically more efficient and frequently preferred. Therefore, certain key embodiments of the devices would comprise multiple semiconductor laser elements emitting at about 980 nm, though the invention clearly also supports use of other types of lasers and at other emission wavelengths. The construction of semiconductor laser structures is dependent on many factors relating to a specific application. The construction of semiconductor lasers is covered extensively in the known art, for instance in the textbook 'Semiconductor Lasers' by Agrawal and Dutta, Van Nostrand Reinhold publishers, July 1993 $2^{nd}$ edition (ISBN 0442011024). In pump lasers for telecommunications amplifiers, many laser structures conform to similar basic principles. The film layers establishing the laser are grown on a wafer of binary compound semiconductor such as Gallium Arsenide (GaAs) or Indium Phosphide (InP). The films may be grown for instance by molecular-beam epitaxy (MBE), chemical beam epitaxy (CBE), metal-organic molecular beam epitaxy (MOMBE), or metalorganic vapor phase epitaxy/metalorganic vapor chemical deposition (MOVPE/MOCVD). There are three key layers or layer groups that can be outlined by example. Firstly there is a lower doped layer of binary or ternary (e.g. Aluminum Gallium Arsenide or AlGaAs) semiconductor in electrical contact with the doped semiconductor wafer substrate. Secondly, above the lower doped layer is one or more layers of binary, ternary or quaternary (e.g. Aluminum Iridium Gallium Phosphide or AlInGaP). If there are multiple layers, they typically would alternate between two different semiconductor compounds. This central group of layers forms the 'active region' where the supplied electrical energy is converted into the optical energy to be emitted. The layers of the active region are extremely thin, typically only tens of Angstroms. This allows for high concentration of the electrical carriers for better efficiency in conversion to optical, but also forms a tight 'well' in the electrical potential across the structure. Therefore, this kind of active layer group is often referred to as a 'quantum well' (QW) or multiple quantum well (MQW). Finally, there is an upper doped layer of binary or ternary semiconductor doped in opposite polarity to the lower doped layer and for external electrical contact to a formed electrode, typically of a metal film. There can also be additional layers throughout the structure to support desirable optical, mechanical, and/or electrical transitions, but these three layer groups are the basis for the fundamental p-i-n (positive-intrinsic-negative) junction diode of the laser. The term 'intrinsic' used here refers to the active layer(s). It is still traditional to refer to the structure as a p-i-n diode. The semiconductor layers so structured can them be patterned into individual lines each being tens or hundreds of microns long and of order 1 micron wide, each such line providing the gain region of a distinct laser element. After patterning the area around each line may be left empty to form 'ridge' lasers, or may be recoated with dielectric and/or semiconductor to form buried-heterostructure lasers. This laser description is meant to describe a simplified example; other types of laser structures can be contemplated and can be employed according to the invention.

Figure 9:
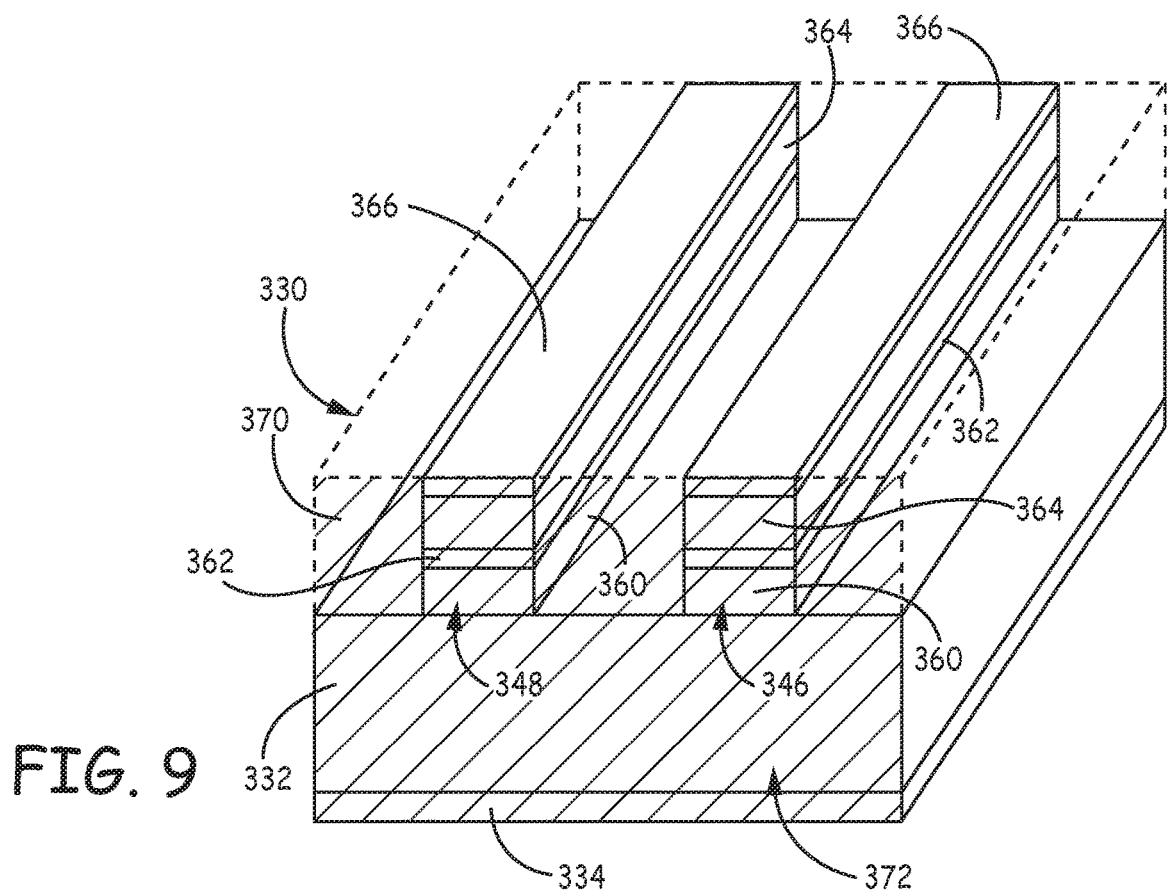
FIG. 9 is a fragmentary perspective view of a portion of a substrate with two laser elements mounted on a substrate forming a lasing diode junction.

A first embodiment of a laser element is shown in FIG. 9 in the context of two laser elements mounted on a substrate to form an array or a fraction thereof. Referring to FIG. 9, structure 330 comprises a substrate 332, a base electrode 334, a first laser element 346 and second laser element 348. First laser element 346 and second laser element 348 each comprise a separate p-i-n junction. Specifically, each of first laser element 346 and second laser element 348 comprises n-doped layer 360, active region 362, p-doped layer 364 and drive electrode 366. An optional dielectric layer 370 can be placed over the surface of substrate 332 at locations not covered by laser elements. Dielectric layer 370 is shown in phantom lines in FIG. 9, and the height of dielectric layer 370 may be commensurate with the top of laser elements 346, 348 to provide a desired degree of surface isolation. Substrate 332 can comprise a doped semiconductor with sufficient doping to provide a desired degree and polarization of electrical conductivity. The end of the device can comprise a reflective coating 372 at least covering the light emitting layers, although as shown in FIG. 9 covering the entire face of the device. The opposite end of the device in FIG. 9 is the light emitting end of the laser elements.

Figure 10:
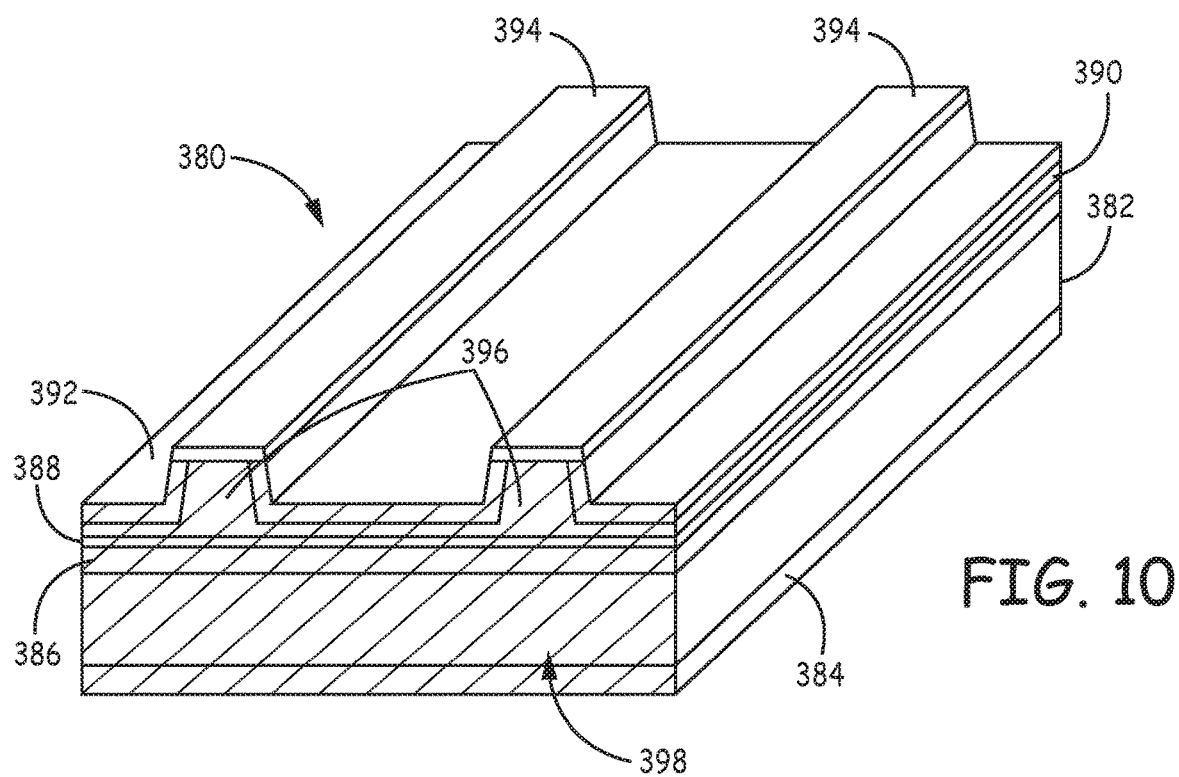
FIG. 10 is a fragmentary perspective view of an alternative embodiments of a portion of a substrate with two laser elements mounted on a substrate sharing common layers of semiconductor forming the lasing diode junction.

An alternative embodiment of a laser element is depicted in FIG. 10. This structure has a desirable construction relative to the embodiment in FIG. 9 since several layers of the structure do not need patterning. Referring to FIG. 10, structure 380 comprises substrate 382, base electrode 384, n-doped layer 386, intrinsic layer 388, p-doped layer 390, dielectric layer 392 and drive electrodes 394. P-doped layer 390 comprises ridges 396 at the locations of the laser elements. Drive electrodes 394 are positioned at the top of ridges 396 in contact with the p-doped layer. Dielectric layer 392 covers the surface of p-doped layer except at the top of the ridges where the drive electrodes are located. Substrate 382 generally comprises a doped semiconductor with sufficient doping to provide a desired degree of electrical conductivity. Current flow from drive electrodes 394 to base electrode 384 drive lasing along the laser elements. The end of the device can comprise a reflective coating 398 at least covering the light emitting layers, although as shown in FIG. 10 covering the entire face of the device. The opposite end of the device in FIG. 10 is the light emitting end of the laser elements.

FIGS. 9 and 10 provide examples of laser element structures that can be integrated into chip to form an integral laser array. In these designs, the active layer can function as a quantum well or injection layer into which electron and holes collect from the adjacent dopes layers. The ends of the laser elements can reflect the light to effectively form a laser cavity, and light then is emitted from the laser cavity along the edge at one end of the laser element. Based on design features in the art for laser diodes, various adjustments can be made to the designs, such as a double heterojunction design in which a p-i-n structure is replaced with a structure having two p-doped materials and two-n-doped materials with appropriately chosen differences in band gaps, or alternative combinations diode junctions, or variations thereof.

For the diodes junction to emit light and correspondingly lase, the semiconductor materials can be selected accordingly. Generally, it is stated that light emitting diodes should comprise direct bandgap materials, which are generally compound semiconductors, such as gallium arsenide, gallium nitride, gallium antimonide, indium phosphide and the like. In some embodiments, a doped InP substrate is used onto which an n-type layer is grown epitaxially. The active layer can comprise InGaAsP, which can form, e.g., a quantum well and/or barrier layer. A top layer can comprise p-type indium phosphide. Suitable deposition techniques, such as chemical vapor deposition can be used to form the layers. The top p-type InP can be etched using photolithography, such as conventional techniques, to form a ridge structure as shown in FIG. 10. A dielectric layer, such as silicon nitride, silicon oxide or the like, can be deposited onto the structure with the patterned ridge. After depositing the dielectric layer, the dielectric layer is etched from the top of the ridge to expose doped semiconductor material, and the top of the ridge can then be correspondingly metalized. In some embodiments, a grating is added to the structure to form a distributed feedback laser. Gratings can be introduced using photolithography during the processing of the structure.

While 4 laser elements are shown in FIG. 7 and two laser elements are shown in fragmentary views of FIGS. 9 and 10, the laser array can comprise a selected number of lasers, such as 5, 6, 7, 8, 9, 10, 11, 12, 13, 14, 15, 16, any integer from 17-100 or more, with each number being expressly contemplated. In general, the lasers can be spaced apart by on the order of 1 micron to 250 microns.

The laser light emitted from the laser array is directed to waveguides leading to the respective elements of an optical amplifier. In some embodiments, the laser light can be directly coupled into a waveguide, or the light couples into the waveguides after a small gap. But the waveguides generally fan out from the laser array on their path to the amplifier. If there is a gap between the edge of the laser array and the leading edge of an output waveguide array, the gap should be small to limit the divergence of the laser beam, but not small on the order of the wavelength of light such that the edge of the laser would not experience a reflective surface.

A typical laser chip is a few millimeters wide, so a laser chip having several elements may be no larger or only slightly larger than a chip having a single laser intended to dissipate the same total power. As can be seen referring to FIG. 5, even constructing a laser array from multiple individual laser chips mounted onto the same submount would have little impact on the package characteristics. Diode laser arrays assembled within a laser chip have been applied to commercially successful lines of telecommunications lasers and clearly demonstrates that multi-element lasers configured to operate to the parameters of a single laser can be as effective and economical as single-element laser diodes.

Laser diodes are not 100% efficient at converting the supplied electrical power into optical output. Typically around 50% or more of the supplied electrical power is converted into heat. The heat raises the temperature of the laser chip, but if the temperature of the chip is allowed to rise too high the laser may not function effectively or at all. Therefore, the heat generated in the package should be efficiently conducted to the external body of the package and surrounding circuit board where it can be removed primarily by conduction to the surrounding air, which may be still or flowing. The internal conduction to the edges of the package may be just the standard thermal conduction of the internal materials, or it may be assisted by thermo-electric cooling devices. A thermo-electric cooler can increase the rate of transfer of heat from the laser die to the package body, but it also adds heat of its own into that flow so the total heat to be externally removed from the package body increases. In practical applications of these laser components, the application specification typically indicate a maximum ambient temperature, a maximum allowed package temperature, and a minimum provided airflow for operation of the device within product specifications. It is generally the combination of these specifications that determines the greatest optical output power the laser component is designed to provide.

Until recently, DWDM system design typically utilized optical amplifiers individually, set up to boost all of the wavelength signals in an optical fiber at once. In such cases the laser component operates mostly within the upper levels of its designed operating range and makes efficient use of the package size and thermal management elements. In recent years emerging DWDM system designs include regions within switching nodes wherein dynamically-selected subsets of wavelengths are routed out of the core fibers and distributed among multiple amplifiers for forwarding to subsequent switching elements. Each such amplifier requires a dedicated pump laser. The operating profile of the pump lasers for these amplifier arrays is notably different than in the traditional single-amplifier application. The required output for each laser at any given time is dependent on the fraction of the total wavelengths passing through the amplifier at that time. The maximum number of wavelengths is set for the entire array, but any distribution of those wavelengths in the elements is possible and changes dynamically as the switching reconfigures. For instance, at one moment all the wavelengths could be passing through one of the amplifiers requiring maximum output from the associated pump laser with all the other amplifiers carrying no wavelengths and requiring only minimal power from each associated pump laser. At another time, 25% of the total wavelengths could pass through each of four amplifiers requiring only about one fourth of the maximum output from each associated pump laser. No matter how the wavelengths are distributed, at any given time most of the pump lasers are operating at a minor fraction of their design maximum output power. Using traditional pump-laser components in this manner results in very inefficient use of space and thermal-management capabilities, especially for amplifier arrays having four or more amplifier elements. There is a compelling need for a new approach to laser components that can provide dynamic power allocation and more efficient use of space and thermal management apparatus in amplifier array applications. The multiple-output laser components described herein address this need.

For efficient operation of a diode laser package having multiple optical outputs, the total output power can be programmatically and dynamically distributed among the optical outputs. The total optical output power can be set to be entirely in any one of the outputs or set to practically any distribution among them. The distribution among the fibers may be readjusted on a time scale of ten microseconds or faster to deal with transient suppression. All of the laser elements can share a common thermal management system, including as necessary thermoelectric cooling (TEC). The cooling system does not need to be 'aware' of any particular programmed power distribution among the outputs. A controller with a processor can dynamically control power distribution to the specific laser elements based on demand for amplification power for a particular channel of the amplifier connected to the optical switch.

In some embodiments of the present invention, a single laser die contains multiple separately addressable laser elements with an operating rule specifying the total optical output power. In such embodiments, the laser elements are generally too close together to directly couple into individual fibers, so these embodiments may also comprise a low-loss passive-waveguide fanout for adapting the laser die geometry to a fiber-array geometry. A low-loss passive-waveguide fanout can be a simpler and effective alternative to a fiber coupling structure such as shown in the '109 patent cited above.

Figure 11:
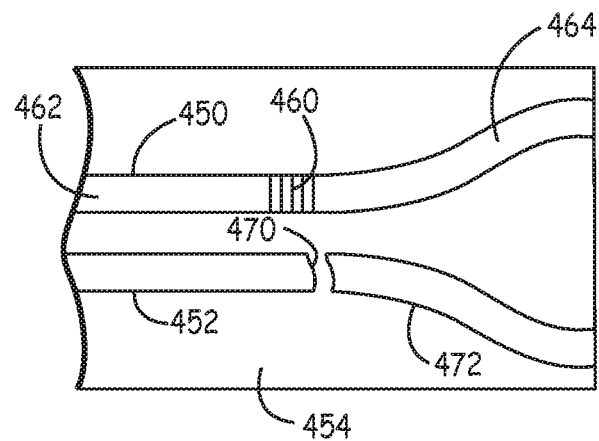
FIG. 11 is a fragmentary top view of a substrate with two diode laser elements coupled into two waveguides that fan out away from the laser elements.

A fragmentary view showing waveguide fan-out is shown in FIG. 11. Referring to FIG. 11, two diode laser elements 450, 452 are shown on a substrate 454. For convenience of compact display only, laser element 450 and laser element 452 are shown with different structures from each other such that two distinct embodiments can be displayed. Laser element 450 can be a distributed feedback laser with a diffraction grating 460 on laser cavity 462. The output from laser cavity 462 couples into a planar waveguide 464 on substrate 454. Laser element 452 has a lasing surface 470 oriented to direct light to planar waveguide 472 that is spaced apart from lasing surface by less than about 5 microns. Waveguides 464, 472 become increasing spaced from each other (fan-out) as the distance from laser elements 450, 452 increases.

Figure 12:
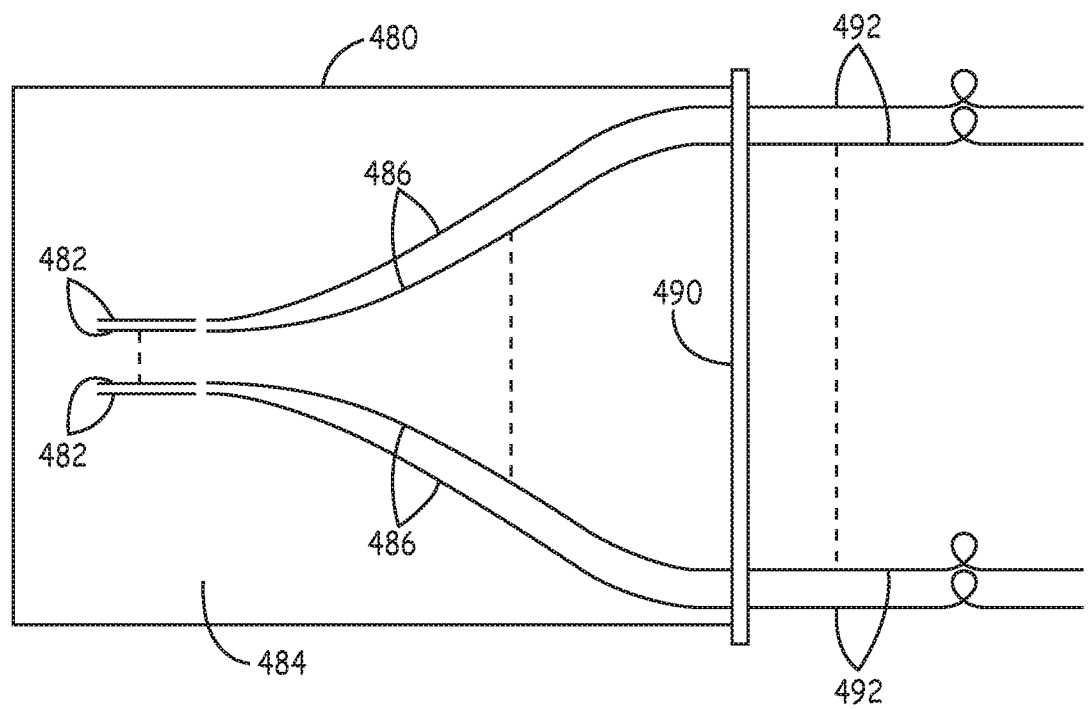
FIG. 12 is a schematic top view in a laser array module with an array of N diode laser elements coupled into an array of N planar waveguides that fan out toward a coupling element.

A top view of a laser module with any top cover removed is shown in FIG. 12. Laser module 480 comprises an array of N diode laser elements 482 on substrate 484 that interface with an array of N planar waveguides 486 that fan-out from each other as the distance increases from the laser elements. Four laser elements and four waveguides are shown in FIG. 12 with " . . . " indicating additional optional corresponding elements if N>4. Waveguides 486 end at connector 490. Connector 490 provides optical connection between waveguides 486 and optical fibers 492 in an array of fibers and physical connection between module 480 and the array of optical fibers. With the additional spacing provided by the fan-out of waveguides 486, connector designs to connect to optical fibers 492 can involve convenient designs, such as conventional designs. Optical fibers 492 can optically couple to EDFAs which then may optically connect an input optical channel and/or to an optical switch. In additional and alternative embodiments, connector 490 can provide optical connection between waveguides 486 of module 480 with waveguides external to module 480.

Figure 13:
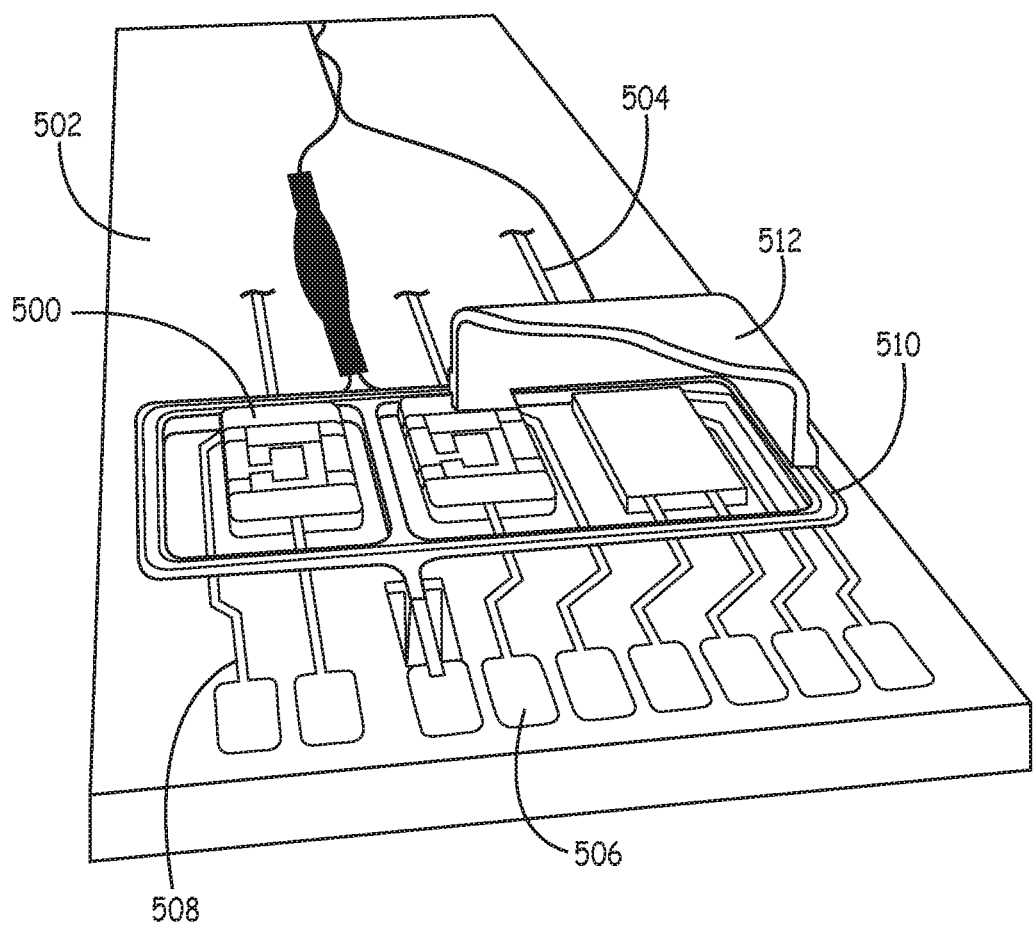
FIG. 13 is a perspective view of a package design with one or more laser die mounted on an interior clearing on a planar waveguide circuit.

In some embodiments of the laser devices described herein, the laser die or dice are mounted on an interior clearing on a planar waveguide circuit (PLC). Referring to FIG. 13, the die or dice 500 are mounted in thermal contact with the silicon PLC 502 substrate to provide thermal conduction to the thermal management features of the package. The laser elements 500 are optically coupled at the edge of the clearing into waveguides 504 of the PLC 502, waveguides 504 can further fan out to the geometry of fiber outputs, similar to the structure in FIG. 12. Electrical bonding pads 506 are placed on PLC 502 near the clearing for connecting via wirebonds 508 to the laser die. A sealing ring 510 further surrounds the clearing and electrical interconnects extend from the bonding pads under the sealing ring, separated from the sealing ring by a dielectric. A hermetic cap 512 (shown in fragmentary view) is bonded to the sealing ring forming a hermetic cavity around the laser die with hermetic optical and electrical feedthrough extending under the seal ring. In this way a hermetic environment is provided for the laser die and the outer package does not need to be hermetic, reducing overall packaging cost. Such embodiments may also have monitor photodiodes or other diagnostic sensors within the hermetic cavity also coupled to electrical feedthrough extending under the seal ring.

In some embodiments of the laser devices, some of the package pins are dedicated to a serial digital interface that can be used to command the distribution of power among the outputs, allowing electrical power for the laser element operation to be drawn from shared electrical power pins. The serial digital interface may further be used for other control and/or diagnostic functions appropriate to the multi-output pump laser component.

The embodiments above are intended to be illustrative and not limiting. In addition, although the present invention has been described with reference to particular embodiments, those skilled in the art will recognize that changes can be made in form and detail without departing from the spirit and scope of the invention. All referenced patents above are hereby incorporated by reference and such incorporation by reference of documents above is limited such that no subject matter is incorporated that is contrary to the explicit disclosure herein.

What is claimed is:

1. A multicast switch module comprising a PLC N×M multicast switch having N inputs (MCS inputs), an array of N independently drivable pump laser elements and an array of N planar waveguides on a common substrate wherein each pump laser element comprises a diode laser having distinct electrical control and optically coupled by a planar waveguide of the array of N planar waveguides to a distinct output fiber, and N optical amplifiers with each optically connected to an input waveguide, the independently drivable laser element and an MCS input.

2. The multicast switch module of claim 1 wherein the optical amplifiers are erbium doped optical amplifiers.

3. The multicast switch module of claim 1 wherein the array of N independently drivable pump laser elements further comprise a common package and a controller, wherein the controller distributes electrical power to each of the laser diodes such that up to a maximum total optical output power can be selectively and dynamically allocated among said diode lasers.

4. The multicast switch module of claim 3 wherein the plurality of laser diodes are thermally coupled to a common heat-removal apparatus.

5. The multicast switch module of claim 1 wherein the array of N independently drivable pump laser elements comprises a plurality of dice mounted on the common substrate.

6. The multicast switch module of claim 5 wherein an electrode is mounted on the common substrate on the side opposite the plurality of dice and wherein each independently drivable pump laser element comprises a counter electrode.

7. The multicast switch module of claim 1 wherein the array of N independently drivable pump laser elements comprises an array of diode lasers on a common substrate sharing a common electrode, a common first doped semiconductor layer, a light emitting intrinsic semiconducting layer, an oppositely doped semiconductor layer with ridges positioned with the intrinsic layer between the common first doped semiconductor layer and the oppositely doped semiconductor layer, and a laser element specific electrode for each laser element positioned in association with the ridge.

8. The multicast switch module of claim 7 further comprising a controller wherein the controller comprises a power supply and electronics for controlling selectable distribution of available power along conduction pathways configured for delivery to one or more individual laser elements of the array.

9. The multicast switch module of claim 8 wherein the controller is connected to an input configured to receive optical switch information and wherein the selected distribution of power to the lasers provide pump laser power for an amplifier receiving an optical signal for amplification.

10. The multicast switch module of claim 7 wherein the array of diode lasers are optically coupled to the multiple outputs through a fanned set of waveguides.

11. The multicast switch module of claim 7 wherein the first doped semiconductor layer comprises n-doped indium phosphide, the oppositely doped semiconductor layer comprises p-doped indium phosphide and the intrinsic semiconducting layer comprises InGaAsP.

12. The multicast switch module of claim 1 further comprising an array of wavelength selective switches with output light channels directed to the optical amplifiers.

13. A multicast switch module comprising a PLC N×M multicast switch having N inputs (MCS inputs), an array of N independently drivable pump laser elements and an array of N planar waveguides on a common substrate, the array of N independently drivable pump laser elements comprising a common package and a controller, wherein each pump laser element comprises a diode laser having distinct electrical control and optically coupled by a planar waveguide of the array of N planar waveguides to a distinct output fiber, and N optical amplifiers with each optically connected to an input waveguide, the independently drivable laser element and an MCS input;

wherein the controller distributes electrical power to each of the laser diodes such that up to a maximum total optical output power can be selectively and dynamically allocated among said diode lasers.

14. The multicast switch module of claim 13, wherein the optical amplifiers are erbium doped optical amplifiers.

15. The multicast switch module of claim 13, wherein the plurality of laser diodes are thermally coupled to a common heat-removal apparatus.

16. The multicast switch module of claim 13, wherein the array of N independently drivable pump laser elements comprises a plurality of dice mounted on the common substrate.

17. The multicast switch module of claim 16, wherein an electrode is mounted on the common substrate on the side opposite the plurality of dice and wherein each independently drivable pump laser element comprises a counter electrode.

18. A multicast switch module comprising a PLC N×M multicast switch having N inputs (MCS inputs), an array of N independently drivable pump laser elements and an array of N planar waveguides on a common substrate wherein each pump laser element comprises a diode laser having distinct electrical control and optically coupled by a planar waveguide of the array of N planar waveguides to a distinct output fiber, and N optical amplifiers with each optically connected to an input waveguide, the independently drivable laser element and an MCS input;

wherein the array of N independently drivable pump laser elements comprises an array of diode lasers on a common substrate sharing a common electrode, a common first doped semiconductor layer, a light emitting intrinsic semiconducting layer, an oppositely doped semiconductor layer with ridges positioned with the intrinsic layer between the common first doped semiconductor layer and the oppositely doped semiconductor layer, and a laser element specific electrode for each laser element positioned in association with the ridge.

19. The multicast switch module of claim 18 further comprising a controller wherein the controller comprises a power supply and electronics for controlling selectable distribution of available power along conduction pathways configured for delivery to one or more individual laser elements of the array.

20. The multicast switch module of claim 19 wherein the controller is connected to an input configured to receive optical switch information and wherein the selected distribution of power to the lasers provide pump laser power for an amplifier receiving an optical signal for amplification.

21. The multicast switch module of claim 18 wherein the array of diode lasers are optically coupled to the multiple outputs through a fanned set of waveguides.

22. The multicast switch module of claim 18 wherein the first doped semiconductor layer comprises n-doped indium phosphide, the oppositely doped semiconductor layer comprises p-doped indium phosphide and the intrinsic semiconducting layer comprises InGaAsP.

* * * * *